United States Patent [19]

Griffis

[11] 4,404,429
[45] Sep. 13, 1983

[54] MATCHING VOLUME CONTROL CHARACTERISTICS FOR TWO CHANNELS

[75] Inventor: Patrick D. Griffis, Indianapolis, Ind.

[73] Assignee: RCA Corporation, New York, N.Y.

[21] Appl. No.: 261,362

[22] Filed: May 7, 1981

[51] Int. Cl.³ .............................................. H03G 3/02
[52] U.S. Cl. .................................. 179/1 VL; 179/1 G
[58] Field of Search ............... 179/1 VL, 1 G, 1 GQ; 330/124 R, 295

[56] References Cited

U.S. PATENT DOCUMENTS 3,702,901 11/1972 Cherry ............................ 179/1 VL

OTHER PUBLICATIONS

RCA Linear Integrated Circuit Databook (1978), pp. 337–339.

Primary Examiner—G. Z. Rubinson
Assistant Examiner—James L. Dwyer
Attorney, Agent, or Firm—E. M. Whitacre; P. J. Rasmussen; L. C. Edelman

[57] ABSTRACT

First and second sound channels are provided for processing audio signals. Each sound channel includes means responsive to a D.C. control voltage for controlling the volume of the audio output signal of the channel. A volume control potentiometer is coupled across two terminals of a source of supply voltage and a D.C. volume control potential is developed at a tap of the potentiometer. The volume control potential is applied to a control electrode of a controlled current path. The controlled current path includes the parallel combination of a first voltage divider and a second, variable voltage divider. A tap of the first voltage divider is coupled to the D.C. control input of the first sound channel, and a tap of the second voltage divider is coupled to the D.C. control input of the second sound channel. By adjusting the second, variable voltage divider, the control voltage provided by the second voltage divider may be set to equalize the D.C. volume control characteristics of the two sound channels.

10 Claims, 2 Drawing Figures

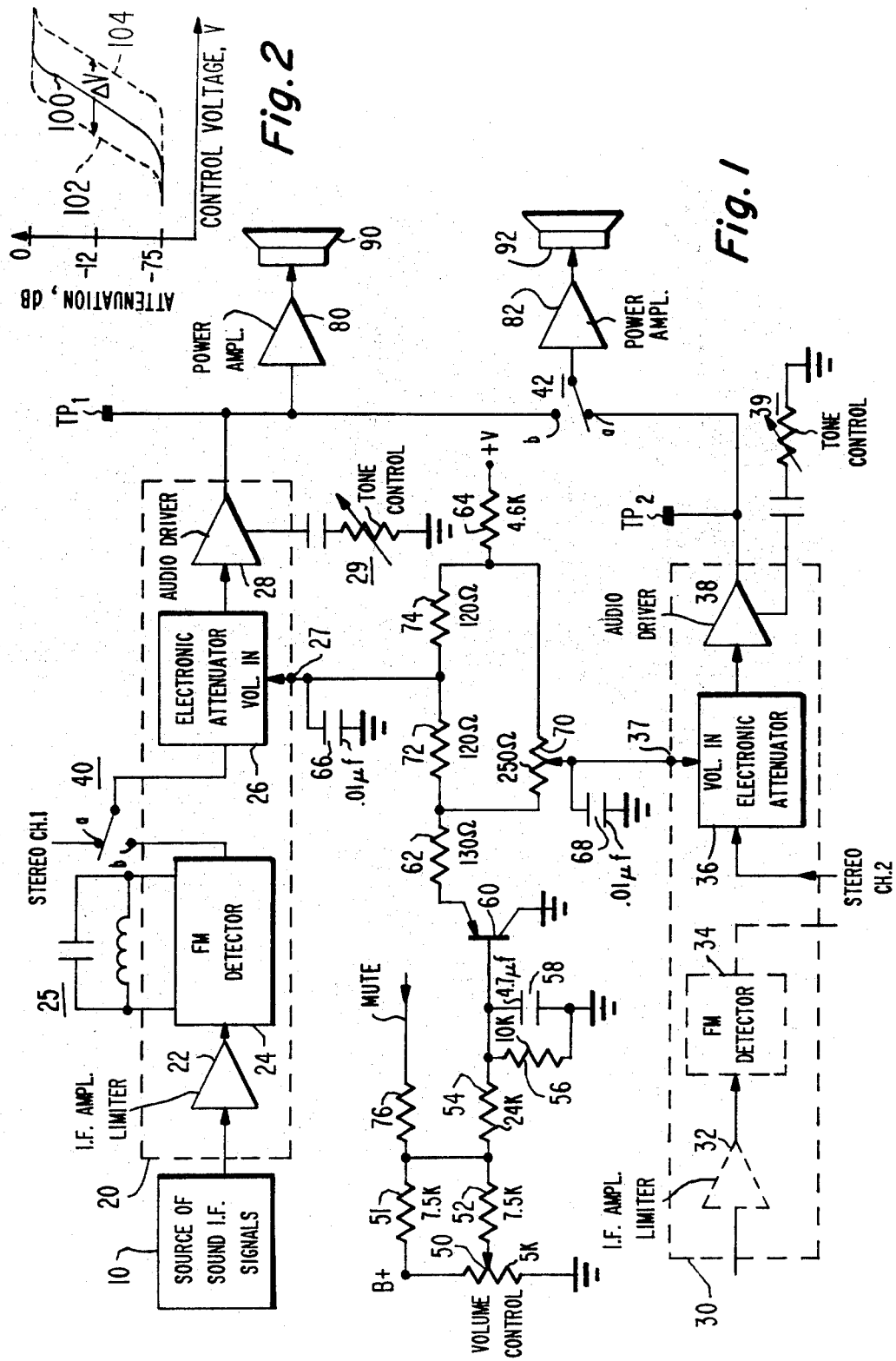

MATCHING VOLUME CONTROL CHARACTERISTICS FOR TWO CHANNELS

This invention relates to control apparatus for audio circuits and, in particular, to apparatus for matching the D.C. volume control characteristics of two audio channels which are subject to different D.C. voltage offsets.

Various types of home entertainment equipment, such as stereo hi-fidelity systems and television receivers, utilize two separate sound channels for reproducing stereophonic sound. In order to control the audio volume produced by the two channels, separate potentiometer controls may be used in each channel. The controls maybe ganged to a single shaft, or adjusted separately by the user to produce the desired volume level for each channel.

Frequently, it is desirable to use a single volume control to simultaneously vary the volume of both channels. The volume control will generally produce a variable D.C. voltage. Each audio channel will include an amplifier or attenuator, the signal gain of which is controlled by the variable D.C. voltage. Audio signal processing integrated circuits such as the TDA 2791 television sound I.F. IC, are available which contain such a D.C. controlled attenuator. By varying the D.C. voltage at the control input of the attenuator, the audio volume may be controlled over a range of approximately 75 dB. One of these integrated circuits may be used for sound processing in each of the two audio channels.

It has been found that the volume control characteristics of integrated circuits of this type may vary over a significant range from one integrated circuit to another. Although the magnitude of the D.C. control range from maximum to minimum volume of each IC will generally be quite similar, the absolute values of the range extremes can differ. This results in a D.C. offset of the control ranges between different IC's. If the D.C. offset is not taken into consideration, one channel may always be noticeably louder than the other over the full control range. Accordingly, it is desirable to provide a single volume control circuit for matching the volume control characteristics of the two channels, so that sound will be reproduced in the two channels at equal volume levels over the full range of volume control.

In accordance with the principles of the present invention, first and second sound channels are provided for processing audio signals. Each sound channel includes means responsive to a D.C. control voltage for controlling the volume of the audio output signal of the channel. A volume control potentiometer is coupled across two terminals of a source of supply voltage and a D.C. volume control potential is developed at a tap of the potentiometer. The volume control potential is applied to a control electrode of a controlled current path. The controlled current path includes the parallel combination of a first voltage divider and a second, variable voltage divider. A tap of the first voltage divider is coupled to the D.C. control input of the first sound channel, and a tap of the second voltage divider is coupled to the D.C. control input of the second sound channel. By adjusting the second, variable voltage divider, the control voltage provided by the second voltage divider may be set to equalize the volume control characteristics of the two sound channels.

In the drawings:

FIG. 1 illustrates, partially in block diagram form and partially in schematic diagram form, volume control apparatus constructed in accordance with the principles of the present invention; and FIG. 2 is a graphical illustration of the range of volume control characteristics of the sound processing integrated circuits shown in the embodiment of FIG. 1.

Referring to FIG. 1, a source of sound I.F. signals 10 applies frequency modulated sound signals to a sound I.F. integrated circuit 20. The integrated circuit 20 includes a series of sound signal processing stages, including an I.F. amplifier and limiter 22, an FM detector 24, an electronic attenuator 26, and an audio driver 28. The FM sound signals are amplified and limited in the amplifier and limiter stages 22, and audio frequency signals are detected by the FM detector 24. A tuned circuit 25 is located external to the integrated circuit 20 and forms a part of the FM detector. The detected audio frequency signals are applied to a terminal "b" of an external switch 40. When the arm of the switch 40 is in the "b" position, the audio signals are applied to the input of the electronic attenuator 26. The gain of the electronic attenuator 26 is controlled by a D.C. control signal applied to its "Volume In" terminal 27 for the purpose of volume control. The audio signals are then applied to an audio driver 28, which produces a low level audio signal at Test Point 1 (TP1). The frequency response of the audio driver may also be controlled for tone control purposes by an external tone control circuit 29, which is coupled to the audio driver 28. The low level audio signals at TP1 are then applied to the input of a power amplifier 80 for reproduction by a loudspeaker 90. The low level audio signals are further applied to a terminal "b" of a switch 42. When the arm of the switch 42 is in the "b" position, the low level audio signals are applied to the input of a second power amplifier 82 for reproduction by a second loudspeaker 92.

The arrangement of FIG. 1 includes provision for reproducing two channels of stereophonic sound provided by an external signal source, such as an FM stereophonic tuner or a stereophonic videodisc player. An audio signal from a stereo channel 1 is applied to terminal "a" of the switch 40. When the switches 40 and 42 are in the "a" position, the channel 1 stereo signal is processed by the electronic attenuator 26, the audio driver 28, and the power amplifier 80 for reproduction by the loudspeaker 90. The volume of the stereo channel 1 is controlled by the D.C. control signal applied to the electronic attenuator 26 at terminal 27, and the frequency response of the signal is controlled by the tone control circuit 29.

For reproduction of a second stereo channel 2, a second electronic attenuator 36 and a second audio driver 38 are coupled to apply a second audio signal to power amplifier 82 and loudspeaker 92. The second electronic attenuator 36 and the second audio driver 38 may be contained in a second integrated circuit 30, which includes stages performing the same functions as the stages of the first integrated circuit 20. The integrated circuit 30 thus contains a second I.F. amplifier and limiter 32 and a second FM detector 34, which are drawn in dashed form to indicate that they perform no function in the embodiment of FIG. 1. An audio signal from a stereo channel 2 is applied to the electronic attenuator 36, which has a "Volume In" terminal 37 to which a D.C. volume control signal is applied. The output of the electronic attenuator 36 is coupled to the input of the audio driver 38, which produces a low level output signal at Test Point 2 (TP2). An external tone control circuit 39 is coupled to the audio driver stage 38 to control the frequency response of the stage for tone control purposes. The audio signal at TP2 is applied to terminal "a" of the switch 42. When the switch 42 is in the "a" position, the stereo channel 2 signal is applied to the input of power amplifier 82 for reproduction of the signal by loudspeaker 92.

In accordance with the principles of the present invention, the volume of the two sound channels is controlled by a single volume control potentiometer 50. The potentiometer 50 is coupled across two terminals (B+ and ground) of a source of supply potential. The wiper arm of the potentiometer 50 is coupled by series resistors 52 and 54 to the base of a transistor 60. A resistor 51 is coupled between the junction of resistors 52 and 54 and the B+ supply. The parallel combination of a resistor 56 and a capacitor 58 is coupled between the base of the transistor 60 and ground. The collector of transistor 60 is coupled to ground and its emitter is coupled by way of a resistor 62 to one end of a potentiometer 70. The other end of the potentiometer 70 is coupled by way of a resistor 64 to a source of supply voltage (+V). The wiper arm of the potentiometer 70 is coupled to the "Volume In" terminal 37 of the electronic attenuator 36. A capacitor 68 is coupled between the "Volume In" terminal 37 of electronic attenuator 36 and ground.

Series-connected resistors 72 and 74 are coupled in parallel with the potentiometer 70. The junction of resistors 72 and 74 is coupled to the "Volume In" terminal 27 of the electronic attenuator 26. a capacitor 66 is coupled between the "Volume In" terminal 27 of electronic attenuator 26 and ground.

The electronic attentuators 26 and 36 of FIG. 1 exhibit a nominal D.C. volume control voltage versus attenuation characteristic as shown by curve 100 in FIG. 2. For example, the electronic attenuator of the TDA 2791 sound IC will nominally provide 0 dB of attenuation when the applied volume control voltage is 3.7 volts. As the control voltage is decreased, the signal attenuation is increased until the attenuators are providing approximately 75 dB of attenuation for a volume control voltage of 2.0 volts.

However, it has been observed that the curve 100 of FIG. 2 is only a nominal curve. Individual integrated circuits may exhibit different response characteristics varying over a range ΔV centered about the nominal curve 100. These response curves are all essentially parallel to each other and exhibit substantially the same attenuation levels at the upper and lower extremes. Extreme boundary curves 102 and 104 are illustratively shown in FIG. 2. The range ΔV in FIG. 2 may typically be 200 millivolts. Thus, it is seen that a D.C. offset which may be as large as ΔV can exist between the volume control response curves of integrated circuits 20 and 30 of FIG. 1. Unless this D.C. offset is compensated for by the volume control circuitry, one audio channel will always be louder than the other over the full range of volume control.

In addition, the D.C. voltage range of the volume control potentiometer 50 can be different from the D.C. control range required by the electronic attenuators. The volume control circuit must therefore provide a scaling and a translation of the input control voltage for the attenuators. The output impedance of the volume control circuit at terminals 27 and 38 must be low enough to be unaffected by changes in the control input impedances of the electronic attenuators. Finally, the input impedance of the volume control circuit must be high enough to be responsive to a mute control signal.

The arrangement of FIG. 1 satisfies all of these requirements. The volume control potentiometer 50 applies a variable control voltage to the base of transistor 60 to control the current flow between the +V supply and ground. The magnitude of the +V supply is chosen to be significantly larger than the required voltages at control terminals 27 and 37. For instance, if the required nominal voltage range is 2.0 to 3.7 volts, a 24 volt supply can be used. The large supply value establishes essentially a constant current flow between the +V supply and ground. With the values of resistors 72 and 74 being equal and chosen to have a sum which is equal to that of potentiometer 70, current from the +V supply and resistor 64 will divide equally through these parallel resistive paths. The voltage at the midpoint of the potentiometer 70 will therefore be equal to the voltage at the junction of resistors 72 and 74. As the control voltage at the base of transistor 60 is varied by adjusting the potentiometer 50, the conductivity of transistor 60 is varied to vary the current flow through the resistors 72 and 74 and the potentiometer 70. The volume of the two audio channels are controlled as the voltages at terminals 27 and 37 are varied in response to the changing currents through the resistive elements.

During set-up of the circuit, potentiometer 70 is adjusted to compensate for any D.C. offset between the volume control response characteristics of the two integrated circuits. With switches 40 and 42 set in the "a" position, a test signal is applied to terminal "a" of switch 40. The volume control potentiometer 50 is then adjusted so that the output signal appearing at TP1 is attenuated by 12 dB relative to the test signal level. The test signal is then applied to the signal input of electronic attenuator 36. Potentiometer 70 is varied until the signal appearing at TP2 is attenuated by 12 dB relative to the test signal level. The volume levels of the two channels are now matched, and will track each other as volume control 50 is varied. No further adjustment of potentiometer 70 is necessary. With the component values illustratively shown in FIG. 1, a ±250 millivolt range of offset correction is possible, which exceeds the maximum required offset adjustment of 200 millivolts.

The volume control circuit of FIG. 1 also provides the necessary scaling and translation of the potentiometer 50 control voltage. With the component values illustratively shown in FIG. 1, a control voltage variable between 1.35 and 6.8 volts is developed at the junction of resistors 52 and 54. This control range is scaled down by divider resistors 54 and 56, producing a control voltage range of 0.4 to 2.0 volts at the base of transistor 60. This voltage range is translated up by the base-emitter junction of transistor 60, the voltage across resistor 62, and the voltages across resistor 72 and potentiometer 70. The resultant voltage range provided at the junction of resistors 72 and 74 and at the midpoint of potentiometer 70 is the desired nominal range of 2.0–3.7 volts.

The circuit output impedances at the volume control terminals 27 and 37 are determined by the values chosen for resistors 62, 72 and potentiometer 70. These values, along with the value of resistor 74, may be scaled as desired to provide a desirable output impedance for the circuit.

Similarly, the circuit input impedance is determined by the values chosen for resistors 54 and 56. These resistor values may likewise be chosen to obtain a desirable input impedance for the circuit.

It is further desirable for the volume control circuit to be responsive to a mute control signal to mute the audio output. When the arrangement of FIG. 1 is used in a television receiver to provide either television sound or reproduction of external stereophonic signals, for instance, it is desirable to mute the television sound during channel change intervals. The television tuner may therefore provide a mute control signal during channel changes. The mute control signal is applied to the input of the volume control circuit at the junction of resistors 52 and 54 by a resistor 76. The muting time constant at the input of the volume control circuit should be selected such that, when volume muting takes place, the volume control voltage to the attenuators changes slow enough so that an annoying "popping" sound is not produced, and recovers fast enough so that normal audio is not muted. The muting time constant may be selected by an appropriate choice of value for capacitor 58. Once the values of resistors 54 and 56 are chosen to provide the desired voltage range scaling and input impedance, the value of capacitor 58 is chosen in accordance with the resistor values to provide the proper volume muting time constant.

What is claimed is:

1. In a system for processing two channels of audio information, including first and second sources of audio information signals; first and second output terminals suitable for coupling to respective loudspeakers for reproducing said audio information; first and second amplifiers having respective inputs, and respective outputs coupled to respective ones of said output terminals; and first and second volume control means having respective audio signal inputs responsive to said first and second audio signals, respective control inputs responsive to respective D.C. control signals for controlling the volume of said reproduced audio information, and respective outputs coupled to respective inputs of said first and second amplifiers; apparatus for producing said D.C. volume control signals comprising:

a volume control potentiometer coupled across two terminals of a source of supply voltage and having a wiper arm; and means, coupled between two terminals of a source of supply potential, for developing said D.C. volume control signals, and including a first voltage divider having a fixed tap coupled to said control input of said first volume control means, a second voltage divider coupled in parallel with said first voltage divider and having an adjustable tap coupled to said control input of said second volume control means, and an input means coupled to said wiper arm of said volume control potentiometer for simultaneously controlling the flow of substantially equal currents through said first and second voltage dividers;

wherein said adjustable tap may be adjusted to provide compensation of any D.C. offset of the D.C. control voltage versus attenuation characteristic of said second volume control means with respect to the D.C. control voltage versus attenuation characteristic of said first volume control means.

2. The system of claim 1, wherein said first voltage divider comprises first and second serially coupled resistors of substantially equal values, the junction of said resistors being coupled to said control input of said first volume control means; said second voltage divider comprises a second potentiometer having a resistance value substantially equal to the sum of the values of said first and second resistors; wherein said second potentiometer is coupled in parallel with said first and second resistors and further includes a wiper arm coupled to said control input of said second volume control means.

3. The system of claim 2, wherein said means for developing said D.C. volume control signals further includes a third resistor coupled between the junction of said first resistor and said second potentiometer and one terminal of said source of supply potential; a transistor having a collector electrode coupled to said other terminal of said source of supply potential, a base electrode coupled to said wiper arm of said volume control potentiometer, and an emitter electrode; and a fourth resistor coupled between said emitter electrode of said transistor and the junction of said second resistor and said second potentiometer.

4. The system of claim 3, wherein the magnitude of said supply potential substantially exceeds the maximum values of said D.C. volume control signals.

5. The system of claim 4, further comprising a third voltage divider including a first end coupled to the wiper arm of said volume control potentiometer, a second end coupled to said collector electrode of said transistor, and an intermediate tap coupled to said base electrode of said transistor.

6. The system of claim 5, wherein said third voltage divider comprises a fifth resistor coupled between said first end and said intermediate tap of said third voltage divider and a sixth resistor coupled between said intermediate tap of said third voltage divider and said collector electrode of said transistor, and wherein said system further comprises a capacitor coupled in parallel with said sixth resistor, said capacitor and said sixth resistor providing an input response time constant for said system.

7. The system of claim 6, further comprising a seventh resistor coupled between said fifth resistor and said wiper arm of said volume control potentiometer, wherein the junction of said fifth and seventh resistors is coupled to a source of volume mute signals.

8. The system of claim 1, further comprising:

a source of carrier signals modulated in frequency by a third audio information signal;

means, having an input coupled to said source of frequency modulated signals, and an output, for demodulating said frequency modulated signals and recovering said third audio information signal;

a first switch having a first input terminal coupled to the output of said demodulating means, a second input terminal coupled to said first source of audio information signals, and a common output terminal for selectively coupling either said first or said second switch terminal to said input of said first volume control means; and a second switch having a first input terminal coupled to the output of said first amplifier, a second input terminal coupled to the output of said second amplifier, and a common output terminal for selectively coupling either said first or said second input terminal of said second switch to said second system output terminal.

9. The system of claim 8, wherein said demodulating means, said first volume control means, said first amplifier are located on a first monolithic integrated circuit chip, and wherein said second volume control means and said second amplifier are located on a second monolithic integrated circuit chip.

10. The system of claim 1, further comprising:
a source of carrier signals modulated in frequency by a third audio information signal;
means, having an input coupled to said source of frequency modulated signals, and an output, for demodulating said frequency modulated signals and recovering said third audio information signal;
a first switch having a first input terminal coupled to the output of said demodulating means, a second input terminal coupled to said first source of audio information signals, and a common output terminal for selectively coupling either said first or said second switch terminal to said input of said first volume control means; and
a second switch having a first input terminal coupled to the output of said first volume control means, a second input terminal coupled to the output of said second volume control means, and a common output terminal for selectively coupling either said first or said second input terminal of said second switch to said input of said second amplifier.

* * * * *